United States Patent
Ostermaier et al.

(10) Patent No.: US 10,199,216 B2
(45) Date of Patent: Feb. 5, 2019

(54) SEMICONDUCTOR WAFER AND METHOD

(71) Applicant: Infineon Technologies Austria AG, Villach (AT)

(72) Inventors: Clemens Ostermaier, Villach (AT); Gerhard Prechtl, Villach (AT); Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 252 days.

(21) Appl. No.: 14/757,896

(22) Filed: Dec. 24, 2015

(65) Prior Publication Data
US 2017/0186600 A1    Jun. 29, 2017

(51) Int. Cl.
*H01L 21/02* (2006.01)
*H01L 31/18* (2006.01)
*C30B 33/08* (2006.01)
*C30B 15/34* (2006.01)
*C30B 29/40* (2006.01)
*H01L 21/304* (2006.01)
*H01L 21/306* (2006.01)
*H01L 21/308* (2006.01)
*H01L 29/06* (2006.01)
*H01L 29/20* (2006.01)

(52) U.S. Cl.
CPC .......... *H01L 21/0254* (2013.01); *C30B 15/34* (2013.01); *C30B 29/406* (2013.01); *C30B 33/08* (2013.01); *H01L 21/02021* (2013.01); *H01L 21/0242* (2013.01); *H01L 21/0243* (2013.01); *H01L 21/0245* (2013.01); *H01L 21/02381* (2013.01); *H01L 21/02433* (2013.01); *H01L 21/02458* (2013.01); *H01L 21/02488* (2013.01); *H01L 21/02494* (2013.01); *H01L 21/02513* (2013.01); *H01L 21/304* (2013.01); *H01L 21/3086* (2013.01); *H01L 21/30612* (2013.01); *H01L 29/0657* (2013.01); *H01L 29/0692* (2013.01); *H01L 29/2003* (2013.01); *H01L 31/1848* (2013.01); *H01L 31/1856* (2013.01)

(58) Field of Classification Search
CPC .............. H01L 21/02021; H01L 21/02; H01L 21/02639; H01L 21/02636; H01L 23/3128; H01L 21/0254; H01L 21/02458; H01L 21/02381; H01L 21/0242; H01L 31/1848; H01L 31/1856; C30B 33/08; C30B 15/34; C30B 29/406
See application file for complete search history.

(56) References Cited

U.S. PATENT DOCUMENTS

| 6,315,826 | B1 * | 11/2001 | Muramatsu | ........... H01L 21/302 117/2 |
| 6,900,522 | B2 * | 5/2005 | Kurita | ............... H01L 21/02021 257/618 |
| 9,355,852 | B2 * | 5/2016 | Yamamoto | ............ H01L 21/304 |

(Continued)

FOREIGN PATENT DOCUMENTS

WO    WO-2015114974 A1 *  8/2015  ........... C23C 16/303

*Primary Examiner* — Jose R Diaz
(74) *Attorney, Agent, or Firm* — Murphy, Bilak & Homiller, PLLC

(57) ABSTRACT

In an embodiment, a method includes treating an edge region of a wafer including a substrate having an upper surface and one or more epitaxial Group III nitride layers arranged on the upper surface of the substrate, so as to remove material including at least one Group III element from the edge region.

12 Claims, 11 Drawing Sheets

(56) References Cited

U.S. PATENT DOCUMENTS 9,842,899 B2 * 12/2017 Ziad .................. H01L 21/02598
2015/0084057 A1 * 3/2015 Ip ........................ H01L 21/0254
  257/76

* cited by examiner

SEMICONDUCTOR WAFER AND METHOD

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a wafer includes a substrate having an upper surface, a side face and a rear surface, and a plurality of epitaxial Group III nitride layers arranged on the upper surface of the substrate. A peripheral region of the upper surface, the side faces and the rear surface of the substrate are uncovered by the plurality of epitaxial Group III nitride layers.

In an embodiment, a method includes treating an edge region of a wafer including a substrate having an upper surface and one or more epitaxial Group III nitride layers arranged on the upper surface of the substrate to remove material including at least one Group III element from the edge region.

In an embodiment, a method includes applying a layer including material incapable of supporting the epitaxial growth of a Group III nitride material in at least a peripheral region of the upper surface of a substrate, epitaxially depositing at least one Group III nitride layer onto regions of the upper surface of the substrate uncovered by the layer, and selectively removing the layer to expose material forming the substrate in the peripheral region.

In an embodiment, a method includes depositing a covering layer onto at least an edge region of a wafer including a substrate having an upper surface and at least one epitaxial Group III nitride layer on the upper surface of the substrate. The covering layer covers material including at least one Group III element positioned in the edge region.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
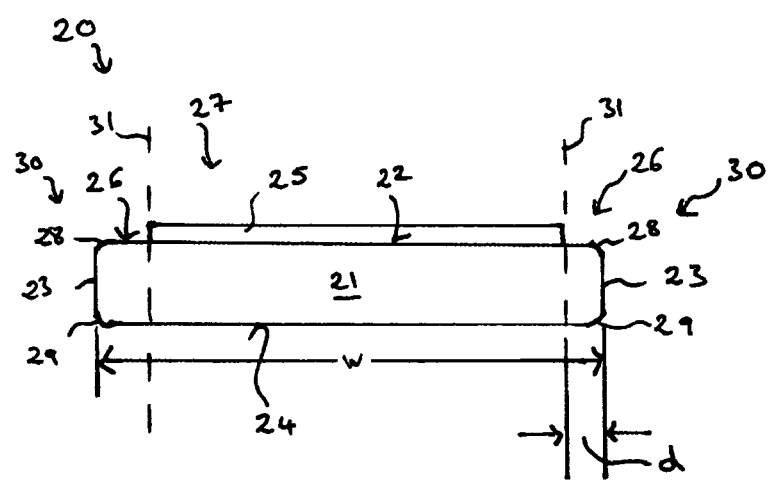
FIG. 1 illustrates a wafer according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein the phrase "Group III" element refers to one of the elements of Group III of the periodic table of elements including aluminum (Al), gallium (Ga) and indium (In).

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$) , for example. Aluminum gallium nitride and AlGaN refers to an alloy described by the formula $Al_xGa_{(1-x)}N$, where $0<x<1$.

FIG. 1 illustrates a wafer 20 including a substrate 21 having an upper surface 22, a side face 23 and a rear surface 24. The wafer 20 further includes a plurality epitaxial Group III nitride layers 25 arranged on the upper surface 22 of the substrate 21. A peripheral region 26 of the upper surface substrate, the side face 23 and the rear surface 24 of the substrate form an edge region 30 which is uncovered by the plurality of epitaxial Group III nitride layers 25.

The substrate 21 has an upper surface 22, which is capable of supporting the epitaxial growth of Group III nitride material in at least an active area 27 of the upper surface 22. The active area 27 is bounded by the peripheral region 26. The border between the active area 27 and peripheral region 16 is indicated with the dashed line 31. The substrate 21 may include a single crystal wafer, such as a single crystal silicon wafer, which in at least in the active area 27 of the upper surface 22, has a surface having a <111> orientation. In other embodiments, the substrate 21 may also include a single crystal silicon carbide wafer, or a sapphire wafer.

In the peripheral region 26, the orientation of the surface of the substrate 21 may differ from the ideal orientation, for example, a <111> orientation in the case of a silicon single crystal wafer 21. This difference may arise from the presence of an upper bevel 28 which extends at an inclined angle between the upper surface 22 and the side face 23 of the wafer 21. The edge region 30 may also include a second lower bevel 29 between the side face 23 and the rear surface 24 of the substrate 21.

The cross-sectional form of the edge region 30 of the substrate, in particular, the form of the upper bevel 28 and the lower bevel 29 may be selected to ease automatic handling of the substrate 21 during production, by avoiding sharp edges which may be prone to damage. The edge region 30 of the substrate 21 may, in a cross-sectional view, have different forms including a trapezoidal form or rounded form or a combination of trapezoidal bevels and a rounded side face 23, for example.

The substrate 21 is typically substantially circular and may include a flat to indicate the physical orientation of the substrate 21. The active area 27 may be substantially circular and the peripheral region 26 may be substantially ring-shaped and border the active area 27 on all sides. The finish of the upper surface 22 may be different to the finish of the rear surface 24. For example, the surface roughness of the polished upper surface 22 may be less than the surface roughness of the rear surface 24.

The edge region 30 and the peripheral region 26 of the upper surface 22 of the wafer 21 has a width d which may lie in the range of 1 mm to 1 cm. The width w of the wafer 21 may lie in the range of 150 mm to 300 mm.

One or more Group III nitride layers 25 are grown on the upper surface 22 of the substrate 21 by one or more of various deposition techniques, including Molecular Beam Epitaxy (MBE) or Metal Organic Chemical Vapour Deposition (MOCVD). In the active area 25, the one of more Group III nitride layers have a monocrystalline structure and an epitaxial relationship with the upper surface 22 of the substrate 21. One of more of the elements of the Group III nitride layers 25 may be deposited onto the edge region 30, in particular, onto the peripheral region 26 of the upper surface 22, upper bevel 28 and side face 23.

The material including the Group III element, which is deposited in the edge region 30, may include non-epitaxially deposited Group III nitride. For example, the region of the Group III nitride layers 25 arranged in the peripheral region 26 of the upper surface 22 of the substrate 21 may have poorer epitaxy compared to those regions of the Group III nitride layers 25 arranged in the active area 23 of the substrate 21.

The peripheral region 26 of the upper surface 22 may include a surface which is incapable of supporting the epitaxial growth of Group III nitride material. If material including Group III nitride is deposited in the peripheral region 26, it may nucleate and grow in a non-epitaxial fashion. A polycrystalline group III nitride layer or particles including a Group III nitride material may be formed in the edge region 30. This polycrystalline Group III nitride material may have a poorer adhesion to the substrate 21 than the epitaxially deposited material in the active area 27. This polycrystalline Group III nitride material may have an increased tendency to be removed from the edge region 30 during handling of the wafer 20. Consequently, it may be desirable to remove the lower quality material from the edge region.

Since wafers such as the wafer 20 are typically handled by physical contact at the edge regions 30 only of the wafer 20, possible contamination of the handling equipment by material present in the edge region 30 may occur. This possibility of contamination may be avoided by preventing physical contact between the edge region 30 and the handling equipment.

One or more of the elements of the epitaxial group III nitride layer present in the edge region 30 may provide a possible source of contamination in the production line if this element or elements comes into contact with the wafer handling equipment. In particular, a Group III element, such as gallium, aluminium or indium may, if it is removed from the substrate 21 and remains within apparatus of the production equipment, provide a source of contamination for a subsequently processed wafer which may negatively influence the properties of devices subsequently processed in the production line, for example silicon-based devices.

In an embodiment, the peripheral region 26 of the upper surface 22, the side face 23 and the rear surface 24 of the substrate 21 are formed by the material of the substrate 21. In these embodiments, the edge region 30 or a portion of the edge region 30 may be treated to remove any material, for example material including a Group III element, from the edge region 30 so that the peripheral region 26 of the upper surface 22, side face 23 and rear surface 24 of the substrate 21 are formed by the material of the substrate 21. In the case of a <111> silicon single crystal wafer substrate, the peripheral region 26 of the upper surface 22, side face 23 and rear surface 24 of the substrate 21 are formed by the material of the substrate 21 are formed by silicon. The edge region may be free of a Group III element or may include less than a threshold concentration of a Group III element, such as less than $1e^{11}$ atoms/cm$^2$.

The Group III nitride material is, therefore, arranged only in the active area 27 in which the Group III nitride layers have an epitaxial relationship with the orientation of the substrate 21. Contact between handling equipment and the wafer 20 is restricted to the edge region 30 such that the handling equipment comes into physical contact with the material of the substrate 21 only and physical contact between the handling equipment and the active area 27 on the upper surface 22 including the plurality of epitaxial Group III nitride layers in the active area 27 is avoided.

A possible source of contamination by a Group III nitride element of the wafer 20, such as material including a Group III nitride material, may be removed in a number of ways from the edge region 30.

As is illustrated in FIG. 1, the edge region 30 may be treated to remove any material positioned in the edge region 30 such that the edge region 30 is formed by the material of the substrate 21. In other embodiments, a source of contamination can be removed by providing an additional physical barrier on the edge region 30 of the substrate 21.

Figure 2:
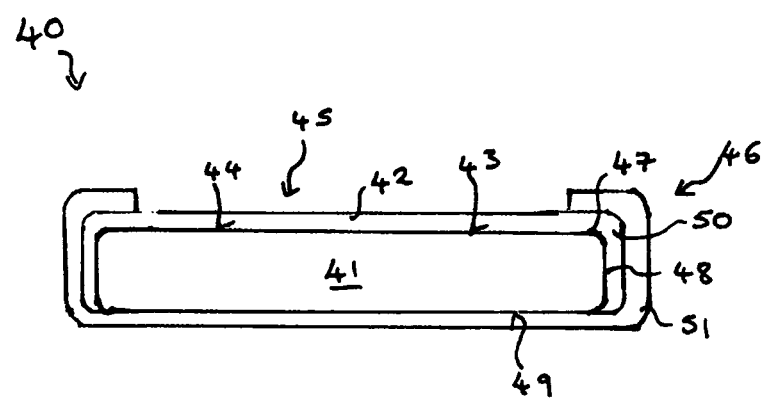
FIG. 2 illustrates a wafer according to a second embodiment.

FIG. 2 illustrates a wafer 40 including a substrate 41 and a plurality of epitaxial Group III nitride layers 42 arranged on a surface 43 of the substrate 41. The substrate 41 includes an upper surface 44 having an orientation which is capable of supporting the epitaxial growth of the Group III nitride layers 42 in an active area 45. The active area 45 bounded by edge region 46 including a peripheral region 47 of the upper surface 44, a side face 48 and a rear surface 49 of the substrate 41. The wafer 40 further includes a dielectric layer 51 which covers the rear surface 49, side face 48 and peripheral region 47 of the upper surface 44.

In this embodiment, material including a Group III element is arranged not only in the active area 45 of the upper surface 42 but also in the peripheral region 47 of the upper surface 44 and on at least a portion of the side face 48. The material 50 positioned in the edge region 46 may include a Group III nitride layer which does not have epitaxial relationship with the underlying surface of the substrate 41.

In the edge region 46 of the wafer 40, the dielectric layer 51 covers the material 50 including a Group III element arranged on the material of the substrate 41 such that the dielectric layer 51 acts as a barrier covering and sealing the material 50 including a Group III element positioned in the edge region 46. The dielectric layer 51 prevents direct physical contact with the underlying material 50 by, for example, wafer handling equipment, during subsequent processing of the wafer 40.

Figure 3:
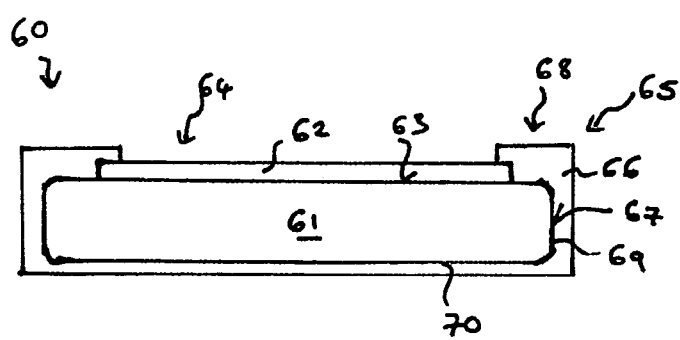
FIG. 3 illustrates a wafer according to a third embodiment.

FIG. 3 illustrates a wafer 60 including a substrate 61 and a plurality of Group III nitride layers 62 arranged on the upper surface 63 in the active area 64 of the substrate 61. The outer surface 67 of the edge region 65 of the substrate 61 is formed by the material of the substrate 61. Furthermore, the material of the substrate 61 in the edge region 66 of the wafer 60 is covered by a dielectric layer 66 such that the dielectric layer 66 is in direct contact with the material of the substrate 61 and covers the peripheral region 68 of the upper surface 63, a side face 69 and rear surface 70 of the substrate 61. The outermost peripheral region of the plurality of epitaxial Group III nitride layers 62 may also be covered by a portion of the dielectric layer 66. The wafer 60 may be fabricated by first treating the edge region 65 of the substrate 61 to remove any material including a Group III nitride layer and, afterwards, depositing the dielectric layer 65 onto the treated edge region 65 to provide an additional protection layer for the wafer 60.

A possible source of contamination by a Group III element in an edge region of a wafer may be removed by removing any material including a Group III element or covering the edge region, at least in portions of the edge region which may come into physical contact with processing apparatus, with a protective coating having a composition without any Group III elements.

The wafer according to any one of the embodiments may be an intermediate product. For example, the wafer may include a single Group III nitride layer, but typically includes a stack of Group III nitride layers epitaxially grown on the upper surface of a substrate. The edge region is cleaned or protected to remove any possible source of contamination by a Group III nitride element before the wafer is further processed. The wafer may then be further processed to produce semiconductor devices including the stack of Group III nitride layers such as Light Emitting Diodes (LEDs) or transistor devices such as High Electron Mobility Transistors (HEMTs). These subsequent processes may include the deposition of metal layers to form a metallization structure and/or electrodes/and/or contact pads.

Methods for treating the edge region of wafers will now be described with reference to flow diagrams.

Figure 4:
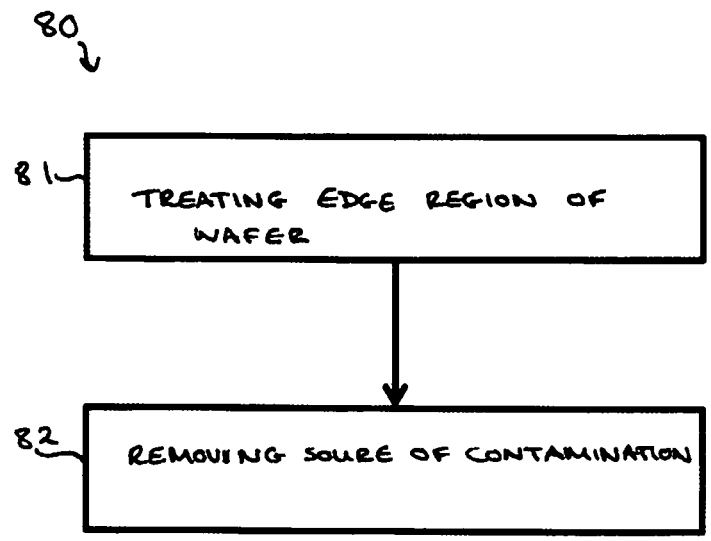
FIG. 4 illustrates a flow diagram of a method for treating an edge region of a wafer according to a first embodiment.

FIG. 4 illustrates a flow diagram 80 of a method according to a first embodiment. In block 81, an edge region of a wafer including a substrate having an upper surface and at least one Group III nitride layer arranged on the upper surface of the substrate is treated. The upper surface of the substrate includes a material having an orientation capable of supporting the epitaxial growth of a Group III nitride layer on the upper surface, such as a polished single crystal having a crystal orientation capable of supporting the epitaxial growth of one or more Group III nitride layers deposited onto the surface. In block 82, a source of contamination by a Group III element is removed from the edge region of the substrate.

The source of contamination by a Group III element may be removed from the edge region in a number of ways. In some embodiments, the source of contamination includes material including a Group III nitride and may include a polycrystalline or non-epitaxial Group III nitride layer or layers, for example, arranged in the edge region. The source of contamination may be removed by removing the material including the Group III nitride element from the edge region of the substrate.

Figure 5:
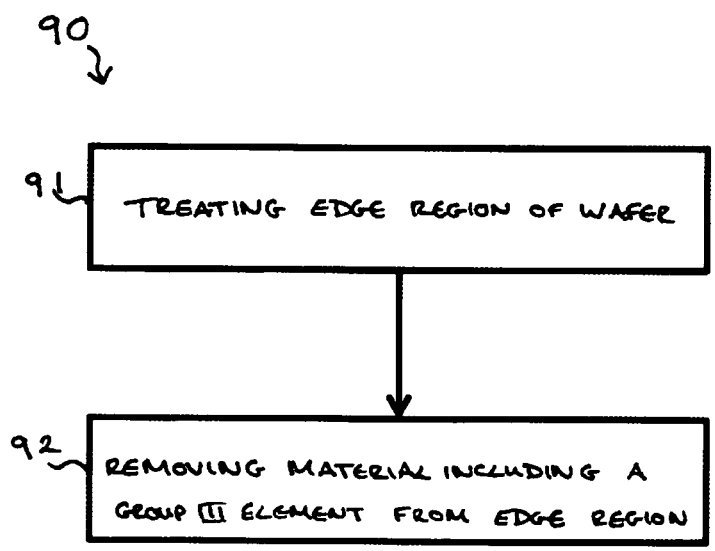
FIG. 5 illustrates a flow diagram of a method for treating an edge region of a wafer according to a second embodiment.

FIG. 5 illustrates a flow diagram 90 of a method according to a second embodiment. In block 91, the edge region of the wafer including a substrate having an upper surface and at least one epitaxial Group III nitride layer arranged on the upper surface of the substrate is treated. In block 92, material including at least one Group III element is removed from the edge region.

The material may be removed from a peripheral region of the upper surface of the substrate including from an upper bevel extending between the upper surface of the substrate and a side face of the substrate. The material may also be removed from the side face of the substrate and, optionally, from a rear surface of the substrate and a lower bevel extending between the side face and the rear surface.

In some embodiments, the material may be mechanically removed from the edge region. Various methods may be used. In some embodiments, the material is mechanically removed by one or more of the techniques of edge cutting, grinding, lapping, polishing and dry etching. Some of the material at the surface of the underlying substrate may also be removed in the edge region by one or more of these methods.

In further embodiments, the material including at least one Group III element may be removed from the edge region by wet etching. In order to wet etch and remove material from only the edge region of the wafer, a mask may be applied to the epitaxial Group III nitride layer(s) and, in particular, to the region of the Group III nitride layers arranged outside of the edge region, for example, in an active area of the upper surface of the substrate, before wet etching is carried out. The Group III nitride layers in the central active area of the substrate typically have the best epitaxy and quality and may be protected from the wet etch solution by the application of a mask.

The mask may be a so-called soft mask such as a photosensitive material or photoresist. The mask may also be a so-called hard mask, such as $SiO_x$, which remains unetched by the wet etch composition. A combination of a hard mask, such as $SiO_x$ and an overlying soft mask such as photoresist may be used.

In some embodiments, the wet etching may selectively etch the material including the Group III nitride element in the edge region over the material including the Group III nitride in the active area. This may be a result of the polycrystalline nature of the material and/or nonuniform coverage and/or cracks and/or poor adhesion to the underlying substrate of the Group III nitride layer in the edge region compared to the monocrystalline epitaxial Group III nitride layer arranged in the active area of the upper surface.

In some embodiments, a combination of dry etching and wet etching may be removed used to remove material including at least one Group III element from the edge region. In an embodiment, an upper region of a layer including a Group III nitride may be removed from the peripheral region, for example from at least the upper bevel of the substrate, by dry etching. The underlying portion of the layer including the Group III nitride in the peripheral region may be removed by wet etching.

In some embodiments, after the material including the Group III element is removed from the edge region, a covering material, such as a dielectric layer, may be deposited onto the peripheral region of the upper surface of the substrate and optionally onto the side face of the substrate and the rear surface of the substrate. The edge regions and rear surface of the substrate may be completely covered by the additional covering layer.

In some embodiments, a physical barrier is provided at the edge region to remove the source of contamination by a Group III element. The polycrystalline nature, and/or cracks or other defects in the region of the Group III nitride layer arranged in the edge region compared to the region of the Group III nitride layer arranged in the active area of the upper surface may result in removal of this material during handling of the wafer which may provide a source of contamination by the Group III nitride element. This possible source of contamination may be removed by covering this material such that it no longer comes into contact with handling equipment and cannot be removed from the wafer by the handling equipment. Consequently, by covering the edge region of the wafer and the Group III nitride layer arranged in the edge region with a covering layer which does not include a Group III element, the source of contamination can be removed.

The covering layer may include silicon nitride ($SiN_x$), silicon oxide ($SiO_x$ or $SiO_2$) and/or polysilicon. A combination of compositions may also be used in a multilayer structure.

Figure 6:
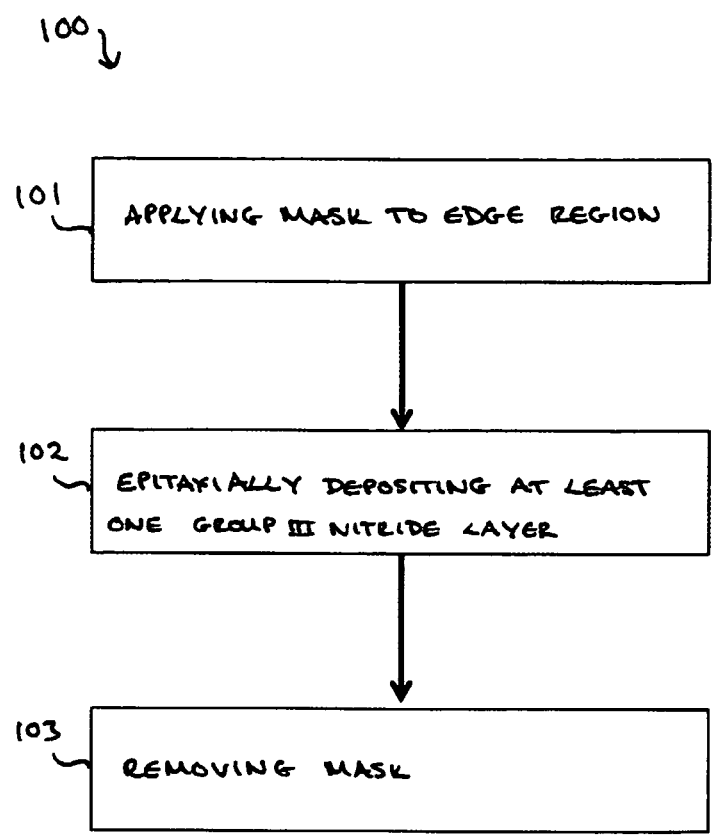
FIG. 6 illustrates a flow diagram of a method for treating an edge region of a wafer according to a third embodiment.

FIG. 6 illustrates a flow diagram 100 of a method for treating an edge region of a wafer such that the finished wafer includes a plurality of epitaxially grown Group III nitride layers and a clean edge region without a Group III element.

In block 101, a layer including material incapable of supporting the epitaxial growth of the Group III nitride material is applied to at least a peripheral region of the upper surface of the substrate. The substrate has an active area on its upper surface which is bordered by the peripheral region and which is capable of supporting the epitaxial growth of the Group III nitride material. The layer, which is applied to the edge region, may be considered as a mask as it prevents the deposition of epitaxial Group III nitride layers in the edge region.

In block 102, one or more Group III nitride layers are epitaxially deposited onto regions of the upper surface of the substrate which are uncovered by the layer. These regions may be the active area of the substrate.

In block 103, the layer including the material incapable of supporting the epitaxial growth of the Group III nitride material is removed to expose the material of the substrate in the peripheral region. Consequently, after selectively lifting off of the layer, the peripheral region is formed by the material of the substrate and does not include a Group III element. The peripheral region is free of a possible source of contamination by a Group III element.

The layer including material incapable of supporting the epitaxial growth of Group III nitride material may be considered as a mask used during growth of the epitaxial Group III nitride layers in the active area of the upper surface of the substrate. The layer may include one or more of amorphous silicon, silicon nitride ($SiN_x$), silicon oxide ($SiO_x$ or $SiO_2$) or polysilicon which are each incapable of supporting the epitaxial growth of Group III nitride material.

In further non-illustrated embodiments, the source of contamination may be removed from the edge region of the wafer by covering the edge region with an additional layer.

The method may include depositing a covering layer onto the edge region of a wafer including a substrate having an upper surface and at least one epitaxial Group III nitride layer arranged on the upper surface of the substrate and material including a Group III element positioned in the edge region. The edge region may include a peripheral region of the upper surface of the substrate. The peripheral region may include an upper bevel extending between the upper surface of the substrate and a side surface of the substrate. The covering layer is arranged on any material arranged in the edge region including any material including a Group III nitride element which is arranged in the edge region. Consequently, the covering layer provides a physical barrier to prevent contact with the underlying material. The covering layer may also cover the entire side face and rear surface of the substrate in addition to the peripheral region of the upper surface. The covering layer may include one or more of silicon nitride, silicon oxide or poly silicon. The material including the Group III element, which is positioned in the edge region and covered by the covering layer, may include non-epitaxially deposited Group III nitride.

Figure 7:
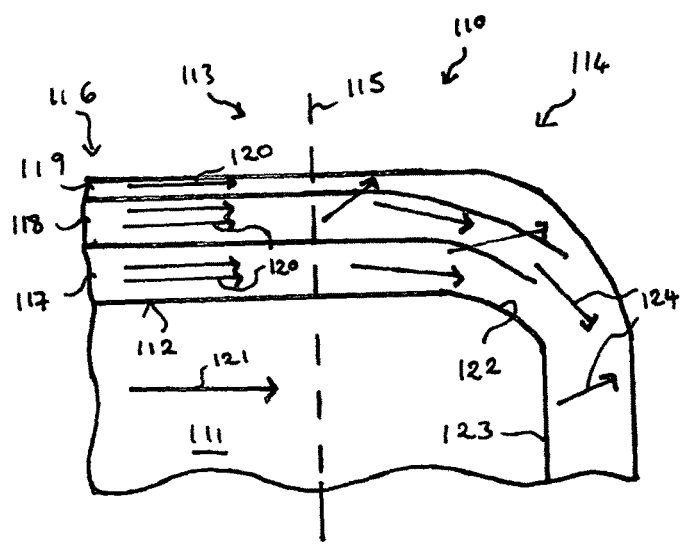
FIG. 7 illustrates a method for treating an edge region of a wafer according to a fourth embodiment.
Figure 7:
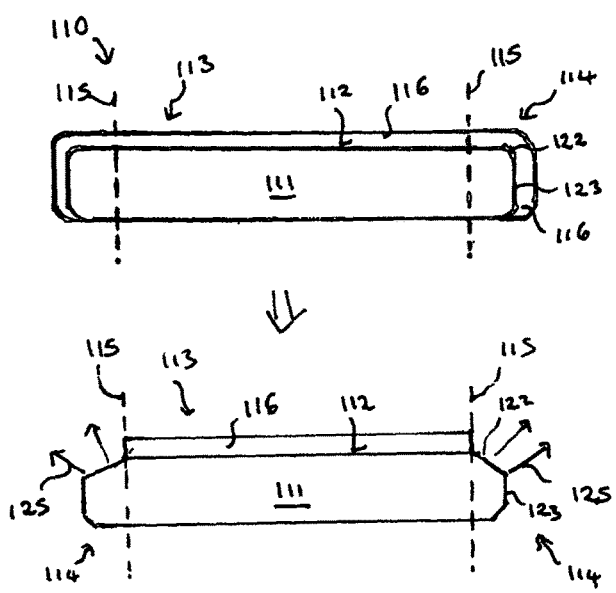

FIG. 7 illustrates a method of treating an edge region of a wafer according to a fourth embodiment.

The wafer 110 includes a substrate 111 having an upper surface 112 which is capable of supporting epitaxial growth of at least one Group III nitride layer. The substrate 111 includes an active area 113 which is bordered on all sides by an edge region 114. The active area 113 may be circular and the edge region 114 may have the shape of a ring. The interface between the active area 113 and the edge region 114 is indicated schematically in FIG. 7 by the dashed lines 115.

As illustrated in the enlarged portion (inset) of FIG. 7, a plurality of Group III nitride layers 116 have been deposited onto the upper surface 112 of the substrate 111. The substrate 111 includes a single crystal silicon wafer which, in this embodiment, includes an upper surface having a <111> orientation. The plurality of Group III nitride layers 116 include a buffer structure 117 which is deposited directly onto the upper surface 112, a first Group III nitride layer 118 which is deposited on the buffer structure 117 and a second Group III nitride layer 119 which is deposited on the first Group III nitride layer 118.

The first Group III nitride layer 118 may include gallium nitride and provide the channel layer of a gallium nitride-based transistor device such as a High Electron Mobility Transistor. The second Group III nitride layer 119 may include aluminium gallium nitride and provide the barrier layer of the gallium nitride-based transistor device.

The buffer structure 117 may include one or more Group III nitride layers. In the case of a plurality of layers, these layers may have differing compositions. For example, the buffer structure 117 may include an AlN buffer in direct contact with the substrate, a superlattice laminate and/or a buffer layer with a compositional gradient from AlN to GaN on the AlN buffer.

In the active area 113, the buffer structure 117, the first Group III nitride layer 118 and the second Group III nitride layer 119 have an epitaxial relationship with the surface 112 of the substrate 111. The orientation of the Group III nitride layers 116 is schematically indicated by the arrows 120 and with the arrow 121 for the substrate 111. The epitaxial relationship is schematically indicated in FIG. 7 by the substantially parallel relationship between the orientation of the arrows 120 and 121.

In contrast, the portion of the Group III nitride layers 116 in the edge regions 114 has a non-epitaxial relationship with the substrate 111 as is schematically indicated in FIG. 7 by the non-parallel arrangement of the arrows 124 compared to the substrate 111.

In the edge region 114, the substrate 111 includes an upper bevel 122, which is inclined at an angle to the upper surface 112 and extends between the upper surface 112 and the side face 123 of the substrate 111. Due to the physical form of the substrate in the edge region 114, the surface of the substrate 111 in the edge region 114 fails to have same <111> orientation as the portion of the upper surface 112 within the active area 113 of the substrate 111. Consequently, in contrast to the active area 113, Group III nitride material deposited in the edge region 114 may be non-epitaxial with respect to the substrate 111, which may result in the growth of polycrystalline material as is indicated by the non-parallel arrangement of arrows 124 in the edge region 114.

In subsequent processing of the wafer 110, the semiconductor devices, in this particular example, the High Electron Mobility Transistor devices, are formed. These subsequent production steps may include the deposition of one or more metallisation layers to form the source electrode, gate electrode and drain electrode of the transistor devices.

These subsequent production processes involve handling the wafer 110, typically automatically. The region of the Group III nitride layers arranged on the edge region 114 may come in contact with this handling equipment since the wafers are typically supported in the edge region 114.

Contact between the Group III nitride material in the edge region 114 and the handling equipment may result in material being inadvertently removed from the wafer. This material become thermally active at high temperatures, which, if used in subsequent processing procedures, may cause contamination of a wafer subsequently processed in the apparatus or production line. This risk may be avoided by removing the portion of the Group III nitride layers 116 which are present in the edge region 114.

In some embodiments, the material is mechanically removed from the edge region 114 of the substrate 111 by, for example, tape grinding as is indicated schematically by the arrows 125 in FIG. 7. During tape grinding, the outermost portion of the upper bevel 122 and side face 123 of the substrate 111 may also be removed such that the contour of the substrate 111 in the edge region 114 may be changed.

The material including a Group III element in the edge region 114 may also be removed by other methods including dry etching and wet etching.

Figure 8:
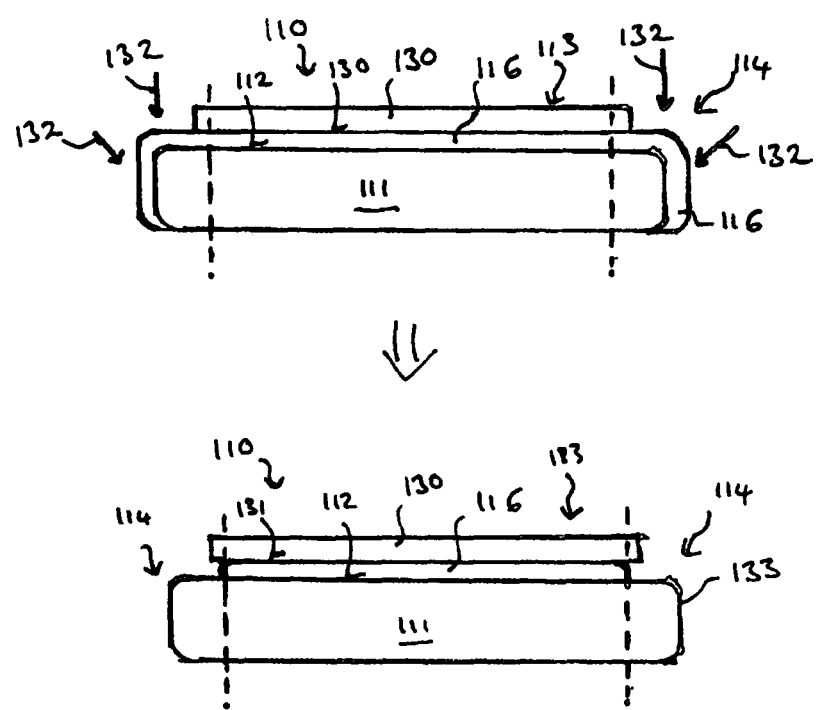
FIG. 8 illustrates a method for treating an edge region of a wafer according to a fifth embodiment.

FIG. 8 illustrates a method for treating the wafer 110 according to a fifth embodiment. The wafer 110 includes one or more Group III nitride layers 116 which have an epitaxial relationship with the substrate 111 in the active area 113 and a non-epitaxial relationship with the substrate in the edge region 114. The wafer 110 is treated by wet etching.

A mask 130 is deposited onto the outer surface 131 of the plurality of Group III nitride layers 116 in at least the active area 113 the substrate 111. The region of the substrate 111 which remain uncovered by the mask 130, i.e. the edge region 114, is removed by wet etching is indicated schematically in FIG. 8 by the arrows 132 such that the outermost surfaces 133 of the wafer 110 in the edge region 114 are formed by the material of the substrate 111, in this case, silicon. There may be some under-etching of the mask 130 such that the lateral extent of the remaining Group III nitride layers 116 arranged underneath the mask 130 is slightly less than a lateral extent of the mask 130. The amount of under-etching can be accommodated by the lateral size of the mask 130 such that the lateral extent of the remaining portion of the Group III nitride layers 116 having an epitaxial relationship with the substrate 111 on the upper surface 112 can be sufficiently accurately obtained. The mask 130 is subsequently removed. The mask may include photoresist or $SiO_x$ or a double layer of $SiO_x$ and photoresist.

In some embodiments, possible contamination of handling equipment by one or more Group III nitride elements arranged in the edge region 114 of the wafer 110 is avoided by providing a physical barrier on the Group III nitride material arranged in the edge region 114.

Figure 9:
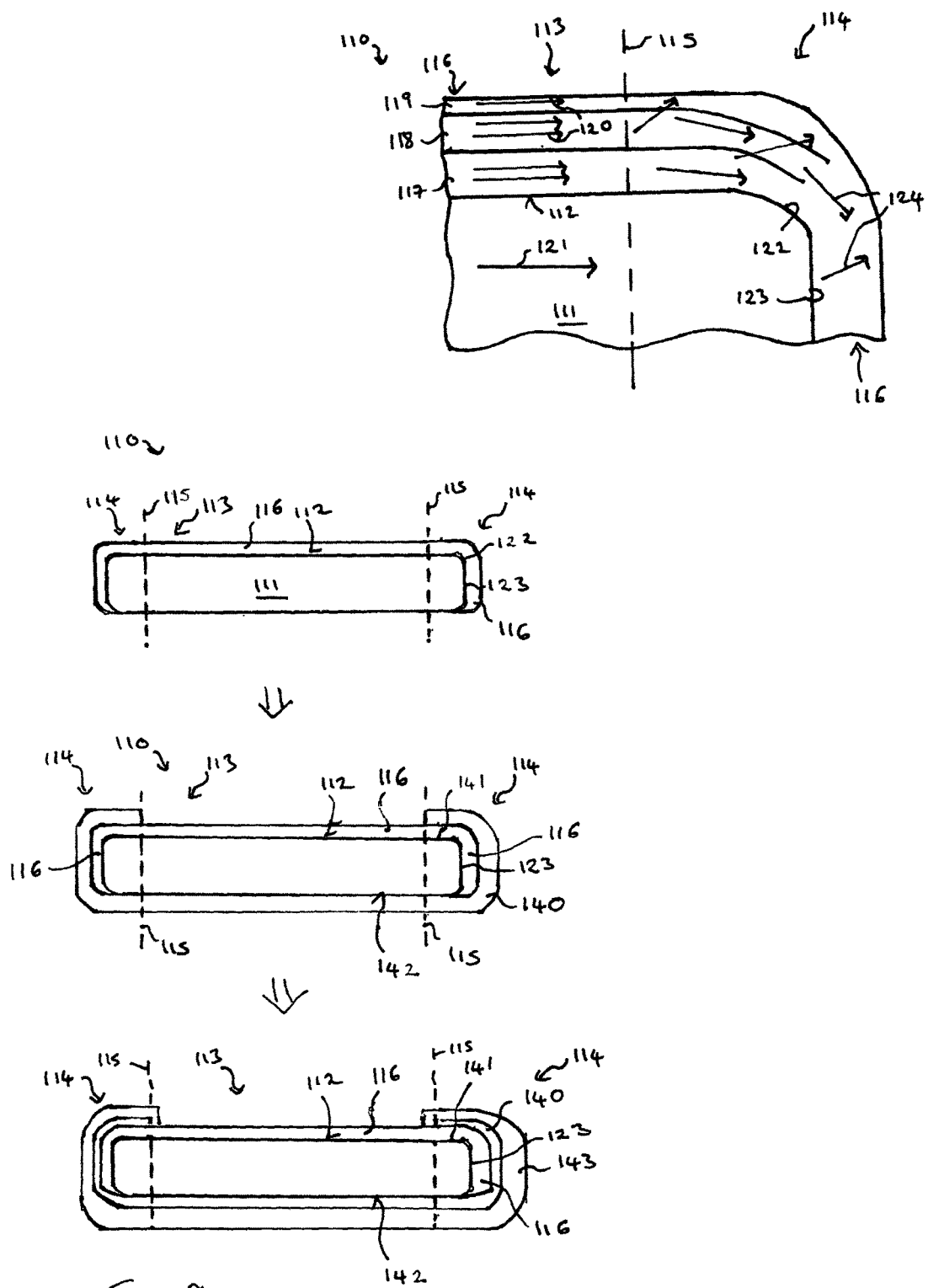
FIG. 9 illustrates a method for treating an edge region of a wafer according to a sixth embodiment.

FIG. 9 illustrates a method according to a sixth embodiment, in which a covering layer 140 is deposited onto the edge region 114 of the wafer 110. The wafer 110 includes a substrate 111 and a plurality of Group III nitride layers 116 as in the embodiment illustrated in FIG. 7.

The covering layer 140 is deposited on the edge region 114 of the wafer 110 such that it covers the portion of the Group III layers 116 positioned in the edge region 114 without an epitaxial relationship with the substrate 111. The covering layer 140 covers the peripheral region 141 of the upper surface 112 of the substrate 111, the side face 123 of the substrate 111 and the rear surface 114 of the substrate 111. The layer 140 may include a material, which acts as a diffusion barrier to Group III elements at the temperatures to which the wafer 110 will be exposed during its subsequent processing.

In some embodiments, a further covering layer 143 is deposited which covers the first covering layer 140 and the edge region 114 including the peripheral region 141 of the upper surface 112, the side face 123 and the rear surface 142 of the substrate 140. The covering layer 140 may include $SiN_x$ and the further covering layer 143 may include $SiO_2$.

The use of one or more covering layers may also be used in combination with methods in which the Group III nitride material is removed from the edge region 114. In these embodiments, any material including a Group III element is removed from the edge region 114 and then the covering layer is applied directly to the material of the substrate 111 in the edge region 114.

Figure 10:
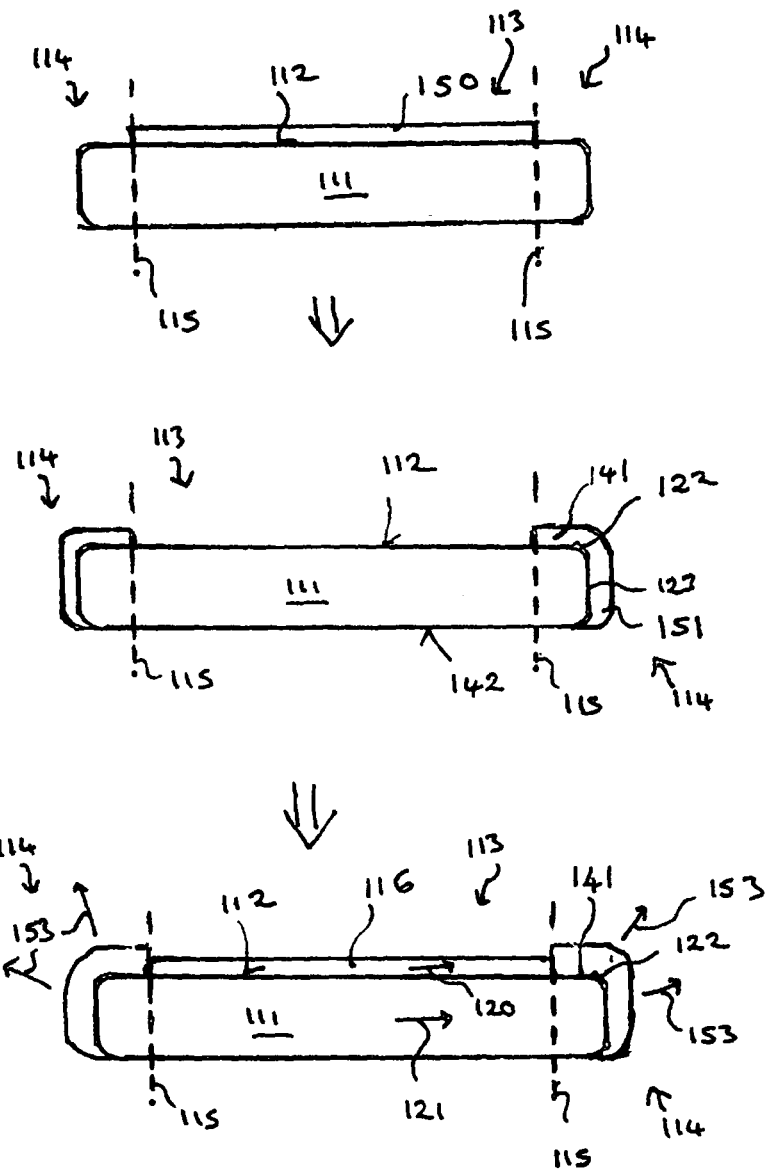
FIG. 10 illustrates a method for treating an edge region of a wafer according to a seventh embodiment.

FIG. 10 illustrates a method for treating the edge region of the wafer 110 before the deposition of any Group III nitride layer on the upper surface 112 of the substrate 111 according to a seventh embodiment.

A mask 150 is applied to the upper surface 112 of the substrate 111 in the active area 113. A layer 151 is deposited in the edge regions 114 such that it covers at least the portions of the edge region 114 onto which subsequently deposited material may be deposited. In the embodiment illustrated in FIG. 10, the layer 151 is arranged in the peripheral region 112 over the upper bevel 122 and on the side face 123. The rear surface 142 of the substrate 111 remains uncovered by the layer 151. However, in other non-illustrated embodiments, the rear surface 142 may also be covered by the layer 151.

The mask 150 is removed and the plurality of Group III nitride layers 116 are deposited onto the upper surface 112 of the substrate 111 and, into the active area 113, which is bounded by the layer 151. In the active area 113, the Group III nitride layer 116 grows epitaxially on the upper surface 112 of the substrate 111 as is indicated schematically in FIG. 10 by the parallel arrangement of the arrows 120 and 121. Material including Group III nitride may also be deposited onto the outermost surface of the layer 151. After growth of the desired epitaxial Group III nitride layers 116 in the active area 113, the layer 151 is removed as schematically indicated by the arrows 153 to leave edge regions 114 formed by the material of the substrate 111 and bordering epitaxially grown Group III nitride layers arranged in the active area 113. Any material including a Group III element or a Group III nitride, which is deposited onto the layer 151, is removed along with the layer 151.

Figure 11:
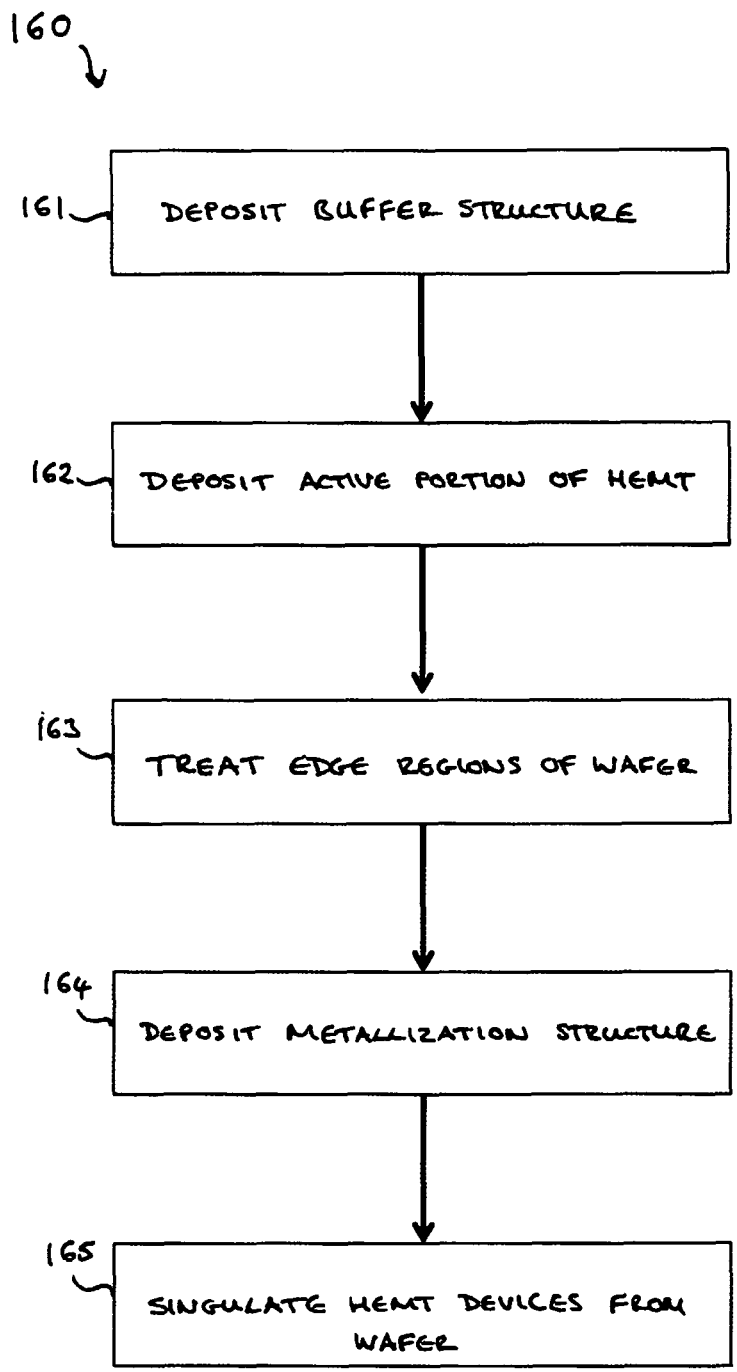
FIG. 11 illustrates a flow diagram of a method for fabricating a Group III nitride High Electron Mobility Transistor.

FIG. 11 illustrates a flow diagram 160 of a method for fabricating a Group III nitride-based High Electron Mobility Transistor (HEMT).

The Group III nitride High Electron Mobility Transistor may be a depletion-mode device or an enhancement-mode device. The Group III nitride High Electron Mobility Transistor may be a high-voltage device which has a blocking voltage capability of at least 300 V or at least 600 V.

In block 161, a buffer structure is deposited onto a substrate having a surface capable of supporting the epitaxial growth of Group III nitride material. The substrate may be a single crystal such as silicon, silicon carbide or suffer. In one embodiment, the substrate is a single crystal silicon wafer having a surface with a <111> orientation. The buffer structure may include one or more Group III nitride layers which are epitaxially grown on the substrate.

In block 162, Group III nitride layers providing the active portion of the High Electron Mobility Transistor device are deposited onto the buffer structure. For example, a channel layer including gallium nitride is deposited on to the buffer structure and a barrier layer including aluminium gallium nitride is deposited on the channel layer. The gallium nitride channel layer is epitaxially grown on the buffer structure and the aluminium gallium nitride barrier layer is epitaxially grown on the gallium nitride channel layer.

In block 163, the edge regions of the wafer are treated to remove portions of the buffer structure and portions of the Group III nitride layers which may have imperfect epitaxy. The edge regions are treated after all of the Group III nitride layers desired for the particular High Electron Mobility Transistor have been deposited and the epitaxial deposition process is completed.

In block 164, a metallisation structure is deposited onto the barrier layer to form a source metallisation, gate metallisation and drain metallisation for each of the High Electron Mobility Transistor devices formed in the epitaxial Group III nitride layers arranged on the substrate.

In block 165, the individual High Electron Mobility Transistor devices are singulated from the wafer.

Figure 12:
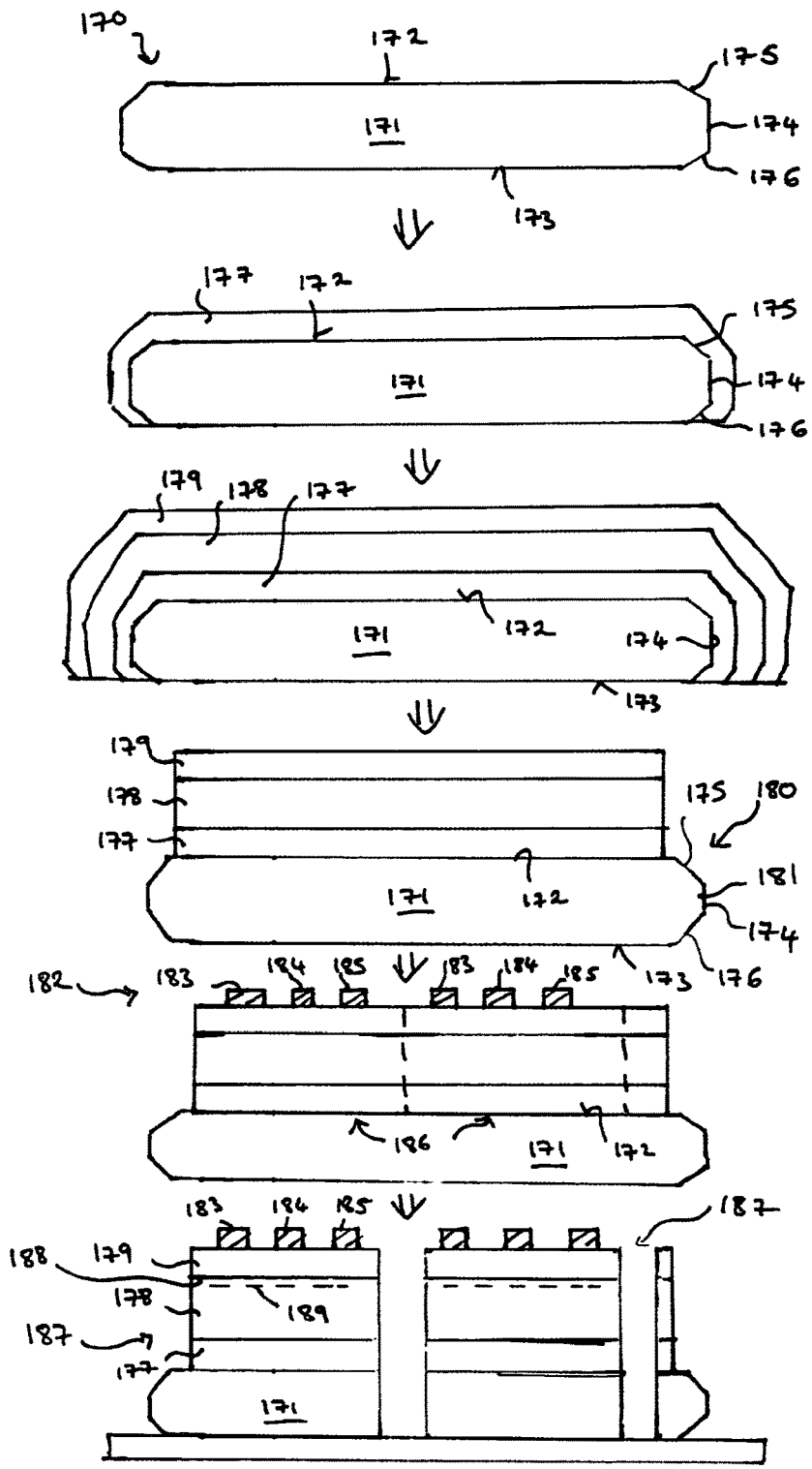
FIG. 12 illustrates a method for fabricating a Group III nitride High Electron Mobility Transistor.

FIG. 12 illustrates a method 170 for fabricating a High Electron Mobility Transistor device. A substrate 171 is provided which includes an upper surface 172 capable of supporting the epitaxial growth of Group III nitride material, a rear surface 173 and a side face 174 which includes an upper bevel 175 extending at an inclined angle between the side face 174 and the upper surface 172 and a lower level 176 extending at an inclined angle between the side face 174 and the lower surface 173. The substrate 171 may be a <111> single crystal silicon wafer.

A buffer structure 177 is deposited onto the substrate 171. The buffer structure 177 may include one or more layers and may be deposited onto the upper surface 172 of the substrate 171, the upper bevel 175 and the side face 174. In some embodiments, the buffer structure may extend partially over the upper bevel 175, or over the upper bevel 175 and partially over the side face 174 or cover the upper bevel 175, the side face 174 and the lower bevel 176.

The buffer structure 177 may be epitaxially deposited on the upper surface 172 of the substrate 171 but may have a non-epitaxial relationship with substrate in the regions deposited on the upper bevel 175, the side face 174 and the lower bevel 176. The buffer structure 177 may include one or more Group III nitride materials in the case of a substrate including a <111> silicon single crystal wafer.

The active layers of the High Electron Mobility Transistor are then deposited on the buffer structure 177. In an embodiment, a first Group III nitride layer 178 which includes gallium nitride is epitaxially deposited on the buffer layer 177 and a second Group III nitride layer 179 including aluminium gallium nitride layer 176 is epitaxially deposited on the first Group III nitride layer 178. The first Group III nitride layer 178 may form the channel layer and the second Group III nitride layer 179 may form the barrier layer of the High Electron Mobility Transistor structure.

The first Group III nitride layer 178 and the second Group III nitride layer 179 may also be deposited onto the upper bevel 175 and onto the side face 174 and, in some embodiments, also onto the lower bevel 176. The portions of the first Group III nitride layer 178 and the second Group III nitride layer 179 arranged in these regions may have a non-epitaxial relationship with the substrate 171 and, therefore, be unsuitable for forming portions of a High Electron Mobility Transistor.

The edge region 180 of the substrate 171 including the upper bevel 175, side face 174 and lower bevel 176 may be treated by removing the portions of the buffer structure 177, the first Group III nitride layer 178 and second Group III nitride layer 176 in these regions to expose the material 181 of the underlying substrate 171 in the edge region 180. In this embodiment, the stack of buffer structure 177, the first Group III nitride layer 178 and second Group III nitride layer 177 is positioned only on the upper surface 172 in regions bounded by the treated edge region 180 which may be termed the active area of the wafer.

The structure including the buffer structure 177, the first Group III nitride layer 178 and second Group III nitride layer 179 is not limited to this exact arrangement and may differ. For example, an aluminium gallium nitride back barrier layer may be provided between the buffer structure 177 and the first Group III nitride layer 178. An additional cap layer including gallium nitride may be arranged on the second Group III nitride layer 179. A passivation layer, for example including silicon nitride, may form the outermost surface of the structure.

The treatment of the edge region 180 to remove the unwanted material is carried out after the epitaxial deposition of the desired structure is completed.

After treatment of the edge region 180 to remove the unwanted layers, a metallization structure 182 may be deposited. The metallization structure 182 may include one or more layers with intervening dielectric layers such that each device position within the wafer is provided with a source pad 183, a gate pad 184 and a drain pad 185 in each device position 186.

The individual High Electron Mobility Transistor devices 187 are then singulated from the wafer, for example by sawing, to provide individual components. Two component positions 186 and two High Electron Mobility transistor devices 187 are illustrated in FIG. 12. However, in practice, hundreds or thousands of devices may be fabricated on a single substrate.

A heterojunction 188 is formed at the interface between the first Group III nitride layer 178 and second Group III nitride layer 179 which supports the formation of a two dimensional electron gas (2DEG) by induced and spontaneous polarization. The two dimensional electron gas is indicated schematically in FIG. 10 by dashed line 189.

Epitaxially grown GaN on Si (111) wafers for HEMTs tend to have a full coverage of $Al_xGa_{x-1}N$ material on the wafer edge, the upper and lower bevel, and the side wall or face of the wafer. Due to the loss of the (111) direction at these areas the nucleation occurs in a random fashion which may produce closed layers, large crystallites and also partially empty areas. Furthermore, the backside of GaN/Si wafers may have areas including Ga which may result from insufficient cleaning of the wafer carrier during growth of the stack of Group III nitride layers.

These defects could cause defects during further processing of such wafers and also Ga contamination in CMOS lines. Gallium acts as a p-type doping with very fast diffusion through silicon oxides starting from temperatures around 700° C. The highest risk of contamination during processing may stem from the edge due to handling, position, and transporting of wafers in boxes. Hence the removal of such layers is may be performed for both GaN production and Si and GaN co-production.

These imperfectly grown III-N layers may be removed down to the silicon substrate using various methods The typical dimensions of the material region to be removed from the edge of the wafer are in the range of the epitaxial layer, for example 2-6 µm. These layers may be fully removed from the wafer edge, the side wall, and the upper and lower bevel, and the wafer backside by chemical etching or mechanical grinding. In addition the wafer may be covered with a dielectric layer in order to prevent direct contact with the material.

Mechanical removal of the wafer edge, the side wall, and the upper and lower bevel, and the wafer backside can be achieved by different grinding and cleaning methods including edge cutting by laser, back side grinding, front side (edge) grinding, or grinding of the whole edge using band-type grinder.

Wet chemical etching is a further simple and cheap method which may be used to remove the unwanted III-N layers and particles. The active wafer area may be masked. Before placing a mask, the whole wafer may be ex-situ or in-situ passivated in order to prevent any modification of the surface structure. Masking may use standard photo-resist which may be removed around the edge either by standard resist removal or preferably by edge and flat/notch exposure. Depending on the etching solvent and temperature, an additional hard mask could be used below the resist. An example is a silicon oxide hard mask used to remove the III-N stack including a SiN passivation layer by hot phosphoric acid.

Alternatively, the wet etching process could be assisted by dry etching. This may be helpful as the good crystal quality of the upper portions of the III-N layer on the top side of the wafer (but at the wafer edge) can strongly reduce the etch rate of hot phosphoric acid on the c-plane of GaN. Dry etching could be used to assist removal of the upper layers until the low quality nucleation region is reached.

In another embodiment, selective growth of the epitaxial Group III nitride layered structure in wafer center and removal of a peripheral mask by lift-off may be used.

Using an amorphous layer on the Si (111) substrate at the edge region, nucleation of III-N layers can be prevented. This however requires a sufficiently large mobility range for the chemical reactants during the epitaxial deposition process.

The fabrication of such peripheral masking layers can be done either by using an mechanical shadow ring during a dry etch process, which etches only the active area of the wafer and prevents ion bombardment from the rest of it, or by using an local oxidation process after a hard mask. The so produced oxide ring could be used directly as a selective growth mask or to define underlying layers by wet chemical etching.

In addition, coverage of the non-active area can be used in order to prevent direct contact to remaining Ga contamination and defects. This may be used if, for example Group III—nitride layers produce defects and cracks in the silicon substrate which allow Ga to remain even after cleaning procedures. Therefore, the covering method can be implemented before or after any mentioned removal method. A covering layer using a 50 nm SiN layer and an 800 nm TEOS layer may be used to reduce the amount of Ga contamination by a factor of 100. The stack could also include poly-silicon in order to slow down Ga diffusion from the inside to the covering surface.

Combinations of the above mentioned methods may be helpful in improving the effectiveness and simplicity of removing the GaN layer from the wafer edge, bevels, and side wall of the substrate.

Using the method of selective re-growth leads to a well-defined low quality deposition of III-N crystallites on the wafer edge, which can be removed much faster as the etch does not depend on the crystal quality any more. In addition, the good etch selectivity of the c-plane compared to other planes allows also a selective removal of any edge particles or regions without etching the active area III-N stack.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of processing a wafer including a substrate having an upper surface, a rear surface opposite the upper surface and a side face between the rear surface and the upper surface, the method comprising:
    forming Group III nitride material on the upper surface and the side face of the substrate;
    removing the Group III nitride material from the side face of the substrate and from a peripheral region of the upper surface of the substrate, the peripheral region bounding an active area of the upper surface, wherein the Group III nitride material that remains on the active area comprises one or more epitaxial Group III nitride layers; and
    after removing the Group III nitride material from the side face of the substrate and from the peripheral region of the upper surface of the substrate, depositing a covering layer onto the peripheral region of the upper surface of the substrate, the side face of the substrate and the rear surface of the substrate.

2. The method of claim 1, wherein the Group III nitride material removed from the peripheral region of the upper surface of the substrate has poorer epitaxy compared to the Group III nitride material that remains on the active area of the upper surface.

3. The method of claim 1, wherein the peripheral region comprises an upper bevel extending between the upper surface of the substrate and the side face of the substrate, and wherein the Group III nitride material is removed from the upper bevel.

4. The method of claim 1, wherein the Group III nitride material removed from the peripheral region of the upper surface of the substrate comprises a polycrystalline group III nitride layer.

5. The method of claim 1, wherein removing the Group III nitride material from the side face of the substrate and from the peripheral region of the upper surface of the substrate comprises mechanically removing the Group III nitride material from the side face and from the peripheral region.

6. The method of claim 5, wherein mechanically removing the Group III nitride material from the side face of the substrate and from the peripheral region of the upper surface of the substrate comprises at least one of edge cutting, grinding, lapping, polishing and dry etching.

7. The method of claim 1, wherein removing the Group III nitride material from the side face of the substrate and from the peripheral region of the upper surface of the substrate comprises wet etching the Group III nitride material from the side face and from the peripheral region.

8. The method of claim 7, further comprising applying a mask to the one or more epitaxial Group III nitride layers on the active area of the upper surface of the substrate before removing the Group III nitride material from the side face of the substrate and from the peripheral region of the upper surface of the substrate.

9. The method of claim 1, wherein removing the Group III nitride material from the side face of the substrate and from the peripheral region of the upper surface of the substrate comprises removing an upper portion of a layer comprising a Group III-nitride from at least an upper bevel of the substrate by dry etching, followed by removing an underlying portion of the layer comprising a Group III-nitride by wet etching.

10. A method of processing a wafer including a substrate having an upper surface, a rear surface opposite the upper surface and a side face between the rear surface and the upper surface, the method comprising:
    forming Group III nitride material on the upper surface and the side face of the substrate, including on a peripheral region of the upper surface that bounds an active area of the upper surface, wherein the Group III nitride material formed on the active area comprises one or more epitaxial Group III nitride layers;
    depositing a first dielectric layer comprising silicon nitride onto at least a region of Group III nitride material that covers the side face of the substrate and the peripheral region of the upper surface of the substrate; and
    depositing a second dielectric layer comprising silicon oxide on the first dielectric layer, the second dielectric layer covering at least the side face of the substrate and the peripheral region of the upper surface of the substrate.

11. The method of claim 10, wherein the first dielectric layer comprises at least one of a $SiN_x$ layer, a $SiO_x$ layer and a polysilicon layer.

12. The method of claim 10, wherein the Group III nitride material has a non-epitaxial relationship with the substrate in the peripheral region of the upper surface.

* * * * *